(12) United States Patent
Ongayi et al.

(10) Patent No.: US 9,182,669 B2
(45) Date of Patent: Nov. 10, 2015

(54) COPOLYMER WITH ACID-LABILE GROUP, PHOTORESIST COMPOSITION, COATED SUBSTRATE, AND METHOD OF FORMING AN ELECTRONIC DEVICE

(71) Applicant: ROHM AND HAAS ELECTRONIC MATERIALS LLC, Marlborough, MA (US)

(72) Inventors: Owendi Ongayi, Marlborough, MA (US); Vipul Jain, North Grafton, MA (US); James F. Cameron, Brookline, MA (US); James W. Thackeray, Braintree, MA (US); Suzanne Coley, Mansfield, MA (US)

(73) Assignee: ROHM AND HAAS ELECTRONIC MATERIALS LLC, Marlborough, MA (US)

( * ) Notice: Subject to any disclaimer, the term of this patent is extended or adjusted under 35 U.S.C. 154(b) by 0 days.

(21) Appl. No.: 14/527,884

(22) Filed: Oct. 30, 2014

(65) Prior Publication Data
US 2015/0177614 A1  Jun. 25, 2015

Related U.S. Application Data

(60) Provisional application No. 61/918,191, filed on Dec. 19, 2013.

(51) Int. Cl.
*G03F 7/039* (2006.01)
*C08F 220/30* (2006.01)
*G03F 7/038* (2006.01)

(52) U.S. Cl.
CPC .............. *G03F 7/038* (2013.01); *C08F 220/30* (2013.01); *G03F 7/0392* (2013.01)

(58) Field of Classification Search
CPC ........ C08F 22/10; C08F 22/14; C08F 220/30; G03F 87/0045; G03F 87/039; G03F 87/0392; G03F 87/20; G03F 7/0045; G03F 7/039; G03F 7/0392; G03F 7/0397; G03F 7/20
See application file for complete search history.

(56) References Cited

U.S. PATENT DOCUMENTS

| | | |
|---|---|---|
| 2,760,863 A | 8/1956 | Plambeck, Jr. |
| 2,850,445 A | 9/1958 | Oster |
| 2,875,047 A | 2/1959 | Oster |
| 3,097,096 A | 7/1963 | Oster |
| 3,427,161 A | 2/1969 | Laridon et al. |
| 3,479,185 A | 11/1969 | Chambers, Jr. |
| 3,549,367 A | 12/1970 | Chang et al. |
| 4,189,323 A | 2/1980 | Buhr |
| 4,442,197 A | 4/1984 | Crivello et al. |
| 4,603,101 A | 7/1986 | Crivello |
| 4,624,912 A | 11/1986 | Zweifel et al. |
| 5,110,709 A | 5/1992 | Aoai et al. |
| 5,344,742 A | 9/1994 | Sinta et al. |
| 5,443,690 A | 8/1995 | Takechi et al. |
| 6,680,157 B1 | 1/2004 | Fedynyshyn |
| 7,022,455 B2 | 4/2006 | Barclay et al. |
| 7,361,444 B1 | 4/2008 | Angelopoulos et al. |
| 8,048,610 B2 | 11/2011 | Ohsawa et al. |
| 8,084,183 B2 | 12/2011 | Yamashita et al. |
| 8,507,176 B2 | 8/2013 | Thackeray et al. |
| 8,968,979 B2 | 3/2015 | Takemura et al. |
| 2003/0232274 A1 | 12/2003 | Barclay et al. |
| 2005/0079438 A1 | 4/2005 | Cao et al. |
| 2009/0269696 A1* | 10/2009 | Ohsawa et al. ............ 430/270.1 |
| 2010/0129738 A1* | 5/2010 | Takemura et al. ................ 430/5 |
| 2010/0196828 A1 | 8/2010 | Kawamura |
| 2011/0159429 A1* | 6/2011 | Thackeray et al. ........ 430/270.1 |
| 2012/0328983 A1 | 12/2012 | Kramer |
| 2013/0137035 A1 | 5/2013 | Wang et al. |
| 2013/0209934 A1 | 8/2013 | Ongayi et al. |
| 2014/0242521 A1* | 8/2014 | Ongayi et al. ................ 430/296 |

FOREIGN PATENT DOCUMENTS

| | | |
|---|---|---|
| EP | 0164248 A2 | 12/1985 |
| EP | 0232972 A2 | 8/1987 |

OTHER PUBLICATIONS

Denbeaux, et al. "Resist Outgassing Contamination Growth Results Using Both Photon and Electron Exposures" Proc. of SPIE vol. 8679, (2013) pp. 86790L-1-86790L-8.
Eschbaumer, et al. "Chemically Amplified Main Chain Scission: New Concept to Reduce Line Edge Roughness and Outgassing" Journal of Photopolymer Science and Technology, vol. 15, No. 4, 2002; pp. 673-676 © 2002TAPJ.
Kikuchi, et al. "Study of EUV Outgassing Spatial Distribution Toward Witness Plate in the EUV Outgas Tester" Proc. of SPIE vol. 8679, (2013) pp. 86790M-1-86790M-9.
Onishi et al. "Acid Catalyzed Resist for KrF Excimer Laser Lithography" Journal of Photopolymer Science and Technology, vol. 4, No. 3 (1991), pp. 337-340.
Pinnow, et al. "Development of Mass Persistent Photoresists" University of Texas, Austin; Downloaded on Jan. 26, 2015 from: http://willson.cm.utexas.edu/Research/Sub_Files/Mass_Persist/Files/157_2nd_Symp_MassPersist.PDF.
Pollentier, et al. "Assessment of Resist Outgassing related EUV optics Contamination for CAR and non-CAR material chemistries" Proc. of SPIE vol. 7972, (2011) pp. 797208-1-797208-12.

* cited by examiner (Continued)

*Primary Examiner* — Anca Eoff
(74) *Attorney, Agent, or Firm* — Cantor Colburn LLP

(57) ABSTRACT

A copolymer includes repeat units derived from a lactone-substituted monomer, a base-soluble monomer having a $pK_a$ less than or equal to 12, a photoacid-generating monomer, and an acid-labile monomer having the formula

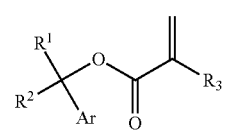

wherein $R^1$, $R^2$, $R^3$, and Ar are defined herein. The copolymer can be used as a component of a photoresist composition, and the photoresist composition can be coated on a substrate having one or more layers to be patterned, or used in a method of forming an electronic device.

10 Claims, No Drawings

COPOLYMER WITH ACID-LABILE GROUP, PHOTORESIST COMPOSITION, COATED SUBSTRATE, AND METHOD OF FORMING AN ELECTRONIC DEVICE

FIELD

The present invention relates to copolymers with acid-labile groups, and use of the copolymers in photoresist compositions.

INTRODUCTION

Extreme ultraviolet (EUV) radiation is strongly absorbed by air, so EUV tools operate under high vacuum to have maximum source intensity. High vacuum increases outgassing of low molecular weight photoresist components, which can deposit on optical elements. The resulting deposition reduces the reflectivity of the mask and imaging mirror, which cause a decrease in EUV energy reaching the wafer surface, leading to lower throughputs and reduced productivity. Contamination can also affect the polarization of reflected light, which can be crucial in the patterning capability of EUV exposure tools. There is therefore a need for photoresist polymers exhibiting reduced outgassing.

SUMMARY

One embodiment is a copolymer comprising repeat units derived from an acid-labile monomer having formula (I)

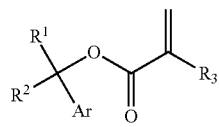

wherein $R^1$ is an unsubstituted or substituted $C_{1-18}$ alkyl, $R^2$ is an unsubstituted or substituted $C_{1-18}$ alkyl, an unsubstituted or substituted $C_{7-18}$ arylalkyl, or an unsubstituted or substituted $C_{6-18}$ aryl, $R^3$ is —H, —F, —CH$_3$, or —CF$_3$, and Ar is an unsubstituted or substituted $C_{6-18}$ aryl, provided that $R^2$ and Ar collectively include at least nine carbon atoms; a lactone-substituted monomer; a base-soluble monomer having a p$K_a$ less than or equal to 12; and a photoacid-generating monomer.

Another embodiment is a photoresist composition comprising the copolymer.

Another embodiment is a coated substrate comprising: (a) a substrate having one or more layers to be patterned on a surface thereof; and (b) a layer of the photoresist composition over the one or more layers to be patterned.

Another embodiment is a method of forming an electronic device, comprising:
(a) applying a layer of a photoresist composition on a substrate; (b) pattern-wise exposing the photoresist composition layer to activating radiation; and (c) developing the exposed photoresist composition layer to provide a resist relief image.

These and other embodiments are described in detail below

DETAILED DESCRIPTION

The present inventors have determined that reduced outgassing is exhibited by photoresists comprising a copolymer incorporating a specific acid-labile monomer.

One embodiment is a copolymer comprising repeat units derived from an acid-labile monomer having formula (I)

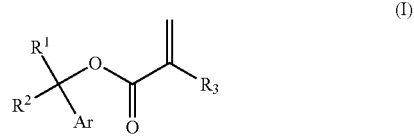

wherein $R^1$ is an unsubstituted or substituted $C_{1-18}$ alkyl, $R^2$ is an unsubstituted or substituted $C_{1-18}$ alkyl, an unsubstituted or substituted $C_{7-18}$ arylalkyl, or an unsubstituted or substituted $C_{6-18}$ aryl, $R^3$ is —H, —F, —CH$_3$, or —CF$_3$, and Ar is an unsubstituted or substituted $C_{6-18}$ aryl, provided that $R^2$ and Ar collectively include at least nine carbon atoms; a lactone-substituted monomer; a base-soluble monomer having a p$K_a$ less than or equal to 12; and a photoacid-generating monomer.

As used herein, the term "alkyl" includes alkyl groups having a linear structure, a branched structure, a cyclic structure, or a combination of two or three of the foregoing structures.

Unless otherwise specified, the term "substituted" means including at least one substituent such as a halogen (i.e., F, Cl, Br, I), hydroxyl, amino, thiol, carboxyl, carboxylate, ester (including acrylates, methacrylates, and lactones), amide, nitrile, sulfide, disulfide, nitro, $C_{1-18}$ alkyl (including norbornyl and adamantyl), $C_{1-18}$ alkenyl (including norbornenyl), $C_{1-18}$ alkoxyl, $C_{2-18}$ alkenoxyl (including vinyl ether), $C_{6-18}$ aryl, $C_{6-18}$ aryloxyl, $C_{7-18}$ alkylaryl, or $C_{7-18}$ alkylaryloxyl. "Fluorinated" shall be understood to mean having one or more fluorine atoms incorporated into the group. For example, where a $C_{1-18}$ fluoroalkyl group is indicated, the fluoroalkyl group can include one or more fluorine atoms, for example, a single fluorine atom, two fluorine atoms (e.g., as in a 1,1-difluoroethyl group), three fluorine atoms (e.g., as in a 2,2,2-trifluoroethyl group), or fluorine atoms at each free valence of carbon (e.g., as in a perfluorinated group such as —CF$_3$, —C$_2$F$_5$, —C$_3$F$_7$, or —C$_4$F$_9$).

In Formula (I), $R^1$ is an unsubstituted or substituted $C_{1-18}$ alkyl. In some embodiments, $R^1$ is an unsubstituted or substituted $C_{1-12}$ alkyl, specifically an unsubstituted or substituted $C_{1-6}$ alkyl, more specifically an unsubstituted $C_{1-6}$ alkyl. Specific examples of $R^1$ include methyl, ethyl, 1-propyl, 2-propyl, cyclopropyl, 1-butyl, 2-butyl, 2-methyl-1-propyl, tertiary-butyl, cyclobutyl, 1-methylcyclopropyl, 2-methylcyclopropyl, 1-pentyl, 2-pentyl, 3-pentyl, 2-methyl-1-butyl, 3-methyl-1-butyl, 2-methyl-2-butyl, 3-methyl-2-butyl, 2,2-dimethyl-1-propyl(neopentyl), cyclopentyl, 1-methylcyclobutyl, 2-methylcyclobutyl, 3-methylcyclobutyl, 1,2-dimethylcyclopropyl, 2,2-dimethylcyclopropyl, 2,3-dimethylcyclopropyl, 1-hexyl, 2-hexyl, 3-hexyl, 2-methyl-1-pentyl, 3-methyl-1-pentyl, 4-methyl-1-pentyl, 2-methyl-2-pentyl, 4-methyl-2-pentyl, 2-methyl-3-pentyl, 3-methyl-2-pentyl, 3-methyl-3-pentyl, 2,2-dimethyl-1-butyl, 3,3-dimethyl-1-butyl, 3,3-dimethyl-2-butyl, 2,3-dimethyl-1-butyl, 2,3-dimethyl-2-butyl, 1,2,2-trimethylcyclopropyl, 2,2,3-trimethylcyclopropyl, (1,2-dimethylcyclopropyl)methyl, (2,2-dimethylcyclopropyl)methyl, 1,2,3-trimethylcyclopropyl, (2,3-dimethylcyclopropyl)methyl, 2,2-dimethylcyclobutyl, 2,3-dimethylcyclobutyl, (1-methylcyclobutyl)methyl, 1,2-dimethylcyclobutyl, 2,3-dimethylcyclobutyl, (2-methylcyclobutyl)methyl, 1,3-dimethylcyclobutyl, 2,4-dimethylcyclobutyl, (3-methylcyclobutyl)methyl, 1-methylcyclopentyl, 2-methylcyclopentyl, cyclopentylmethyl, cyclohexyl, 1-norbornyl, 2-norbornyl, 3-norbornyl, 1-adamantyl, 2-adamantyl, octahydro-1-pentalenyl, octahydro-2-pentalenyl, octahydro-3-pentalenyl, octahydro-1-phenyl-1-pentalenyl, octahydro-2-phenyl-2-pentalenyl, octahydro-1-phenyl-3-pentalenyl, octahydro-2-phenyl-3-pentalenyl, decahydro-1-naphthyl, decahydro-2-naphthyl, decahydro-3-naphthyl, decahydro-1-phenyl-1-naphthyl, decahydro-2-phenyl-2-naphthyl, decahydro-1-phenyl-3-naphthyl, and decahydro-2-phenyl-3-naphthyl. In some embodiments, $R^1$ is $C_{1-3}$ alkyl. In some embodiments, $R^1$ is methyl, ethyl, 1-propyl, or 2-propyl. In some embodiments, $R^1$ is methyl.

In Formula (I), $R^2$ is an unsubstituted or substituted $C_{1-18}$ alkyl, an unsubstituted or substituted $C_{7-18}$ arylalkyl, or an unsubstituted or substituted $C_{6-18}$ aryl. In some embodiments, $R^2$ is an unsubstituted or substituted $C_{1-12}$ alkyl, an unsubstituted or substituted $C_{7-13}$ arylalkyl, or an unsubstituted or substituted $C_{6-12}$ aryl. Specific examples of unsubstituted or substituted $C_{1-18}$ alkyl are listed above in the context of $R^1$. Specific examples of unsubstituted or substituted $C_{7-18}$ arylalkyl include benzyl, 1-phenylethyl, 2-phenylethyl, 1-methyl-1-phenylethyl, (4-methylphenyl)methyl, (4-t-butylphenyl)methyl, 1-(4-methylphenyl)ethyl, 1-(4-t-butylphenyl)ethyl, 2,3-dihydro-1-indenyl, 2,3-dihydro-1-methyl-1-indenyl, 2,3-dihydro-2-methyl-1-indenyl, 2,3-dihydro-3-methyl-1-indenyl, 1,2,3,4-tetrahydro-1-naphthyl, 1,2,3,4-tetrahydro-2-naphthyl, 1,2,3,4-tetrahydro-1-methyl-1-naphthyl, 1,2,3,4-tetrahydro-2-methyl-1-naphthyl, 1,2,3,4-tetrahydro-1-methyl-2-naphthyl, 1,2,3,4-tetrahydro-2-methyl-2-naphthyl, 1,2,3,4-tetrahydro-1-phenyl-1-naphthyl, 1,2,3,4-tetrahydro-2-phenyl-1-naphthyl, 1,2,3,4-tetrahydro-1-phenyl-2-naphthyl, and 1,2,3,4-tetrahydro-2-phenyl-2-naphthyl. Specific examples of unsubstituted or substituted $C_{6-18}$ aryl include phenyl, 2-methylphenyl, 3-methylphenyl, 4-methylphenyl, 3-t-butylphenyl, 4-t-butylphenyl, 1-naphthyl, 2-naphthyl, biphenyl, 1-phenanthryl, 2-phenanthryl, 9-phenanthryl, 1-anthryl, 2-anthryl, 9-anthryl, 1-acenaphthyl, 3-methyl-1-acenaphthyl, 4-ethyl-1-acenaphthyl, 1-phenalenyl, and 2-methyl-1-phenalenyl. In some embodiments, $R^2$ is $C_{1-3}$ alkyl, phenyl, or $C_{1-6}$ alkyl-substituted phenyl. In some embodiments, $R^2$ is methyl, ethyl, 1-propyl, 2-propyl, 1-butyl, or phenyl.

In Formula (I), $R^3$ is —H, —F, —$CH_3$, or —$CF_3$. In some embodiments, $R^3$ is —H or —$CH_3$. In some embodiments, $R^3$ is —$CH_3$.

In Formula (I), Ar is an unsubstituted or substituted $C_{6-18}$ aryl. Specific examples of unsubstituted or substituted $C_{6-18}$ aryl include phenyl, 2-methylphenyl, 3-methylphenyl, 4-methylphenyl, 3-t-butylphenyl, 4-t-butylphenyl, 1-naphthyl, 2-naphthyl, biphenyl, 1-phenanthryl, 2-phenanthryl, and 9-phenanthryl [?]. In some embodiments, Ar is phenyl, $C_{1-6}$-alkyl-substituted phenyl, biphenyl, or naphthyl. In some embodiments, Ar is phenyl, 4-t-butylphenyl, biphenyl, or 2-naphthyl.

In Formula (I), $R^2$ and Ar collectively include at least nine carbon atoms. In some embodiments, $R^2$ and Ar collectively include at least ten carbon atoms, specifically at least eleven carbon atoms, more specifically at least twelve carbon atoms.

In some embodiments, the acid-labile monomer comprises

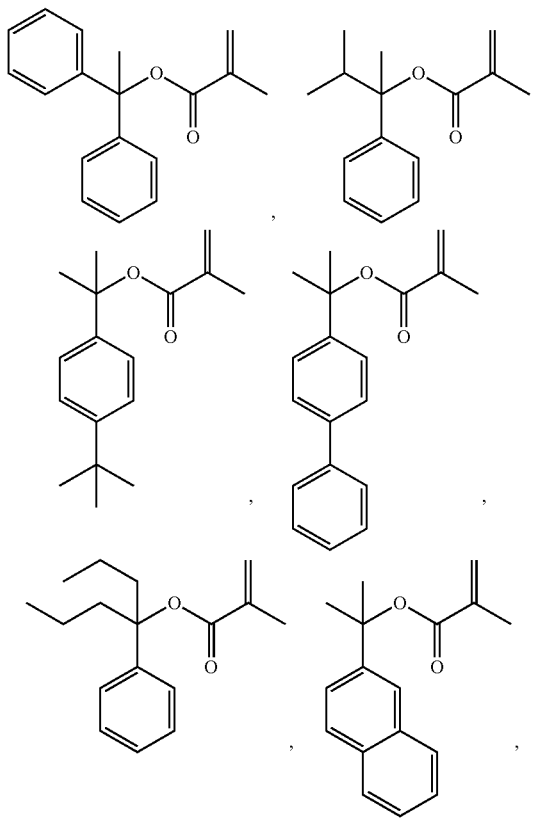

or a combination thereof.

In some embodiments, the copolymer comprises 10 to 60 mole percent of repeat units derived from the acid-labile monomer, based on 100 mole percent repeat units for the copolymer as a whole. Within this range, the mole percent of repeat units derived from the acid-labile monomer can be 15 to 50 mole percent, specifically 20 to 55 mole percent, more specifically 25 to 50 mole percent.

In addition to repeat units derived from an acid-labile monomer, the copolymer comprises repeat units derived from a lactone-substituted monomer, a base-soluble monomer having a p$K_a$ less than or equal to 12, and a photoacid-generating monomer.

Any lactone-substituted monomer useful for forming a 193 nanometer photoresist copolymer can be used. Exemplary such lactone-containing monomers include

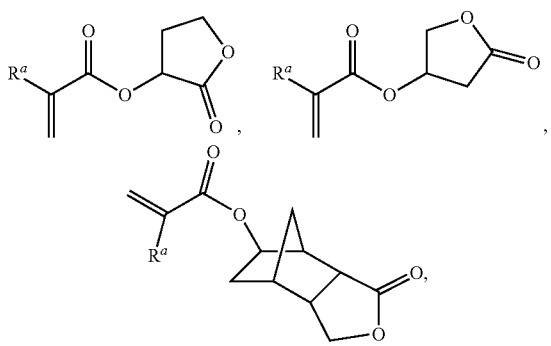

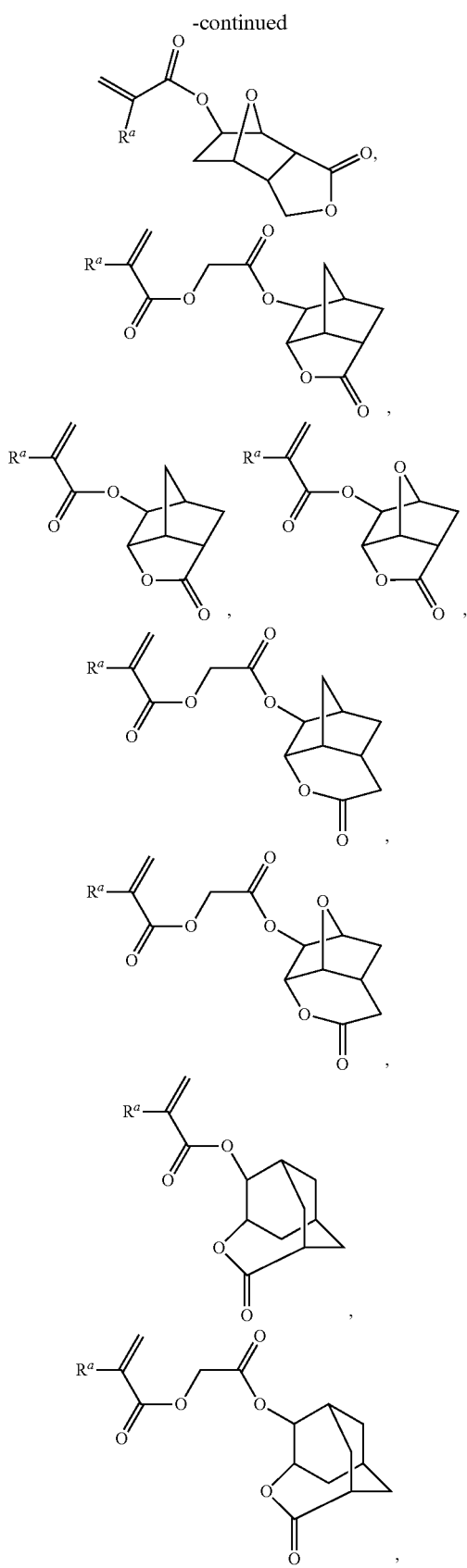

and combinations thereof, wherein $R^a$ is H, F, CN, $C_{1-10}$ alkyl, or $C_{1-10}$ fluoroalkyl.

In some embodiments, the copolymer comprises 25 to mole percent of repeat units derived from the lactone-substituted monomer, based on 100 mole percent repeat units for the copolymer as a whole. Within this range, the mole percent of repeat units derived from the lactone-substituted monomer can be 30 to 60 mole percent, specifically 35 to 55 mole percent.

The base-soluble monomer has a $pK_a$ less than or equal to 12, measured at 25° C. and 1 weight percent in dimethylsulfoxide. Within this limit, the $pK_a$ can be 6 to 12, specifically 7 to 11, more specifically 7 to 10. In some embodiments, the base-soluble monomer has formula (II)

(II)

wherein $R^a$ is —H, —F, —CH$_3$, or —CF$_3$, x is 0 or 1, L is —C(O)—O— or $C_{1-20}$ unsubstituted or substituted hydrocarbylene, and Z is a halogenated or non-halogenated, aromatic or non-aromatic $C_{2-20}$ hydroxyl-containing organic group having a $pK_a$ of less than or equal to 12. In some embodiments, Z comprises a 1,1,1,3,3,3-hexafluoro-2-hydroxyprop-2-yl group. As used herein, the term "hydrocarbyl", whether used by itself, or as a prefix, suffix, or fragment of another term, refers to a residue that contains only carbon and hydrogen unless it is specifically identified as "substituted hydrocarbyl". The hydrocarbyl residue can be aliphatic or aromatic, straight-chain, cyclic, bicyclic, branched, saturated, or unsaturated. It can also contain combinations of aliphatic, aromatic, straight chain, cyclic, bicyclic, branched, saturated, and unsaturated hydrocarbon moieties. Specific examples of base-soluble monomers of formula (II) include

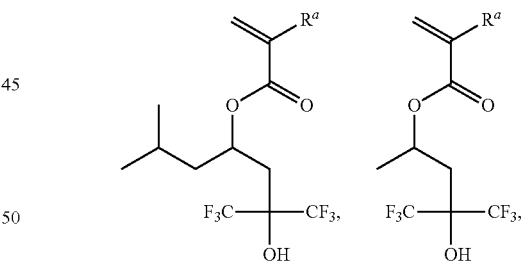

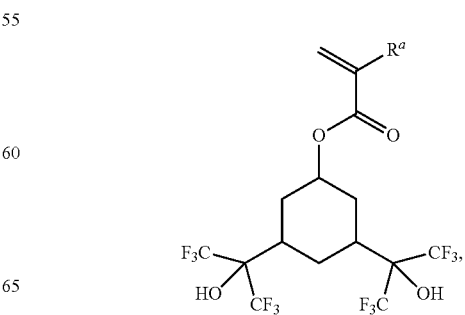

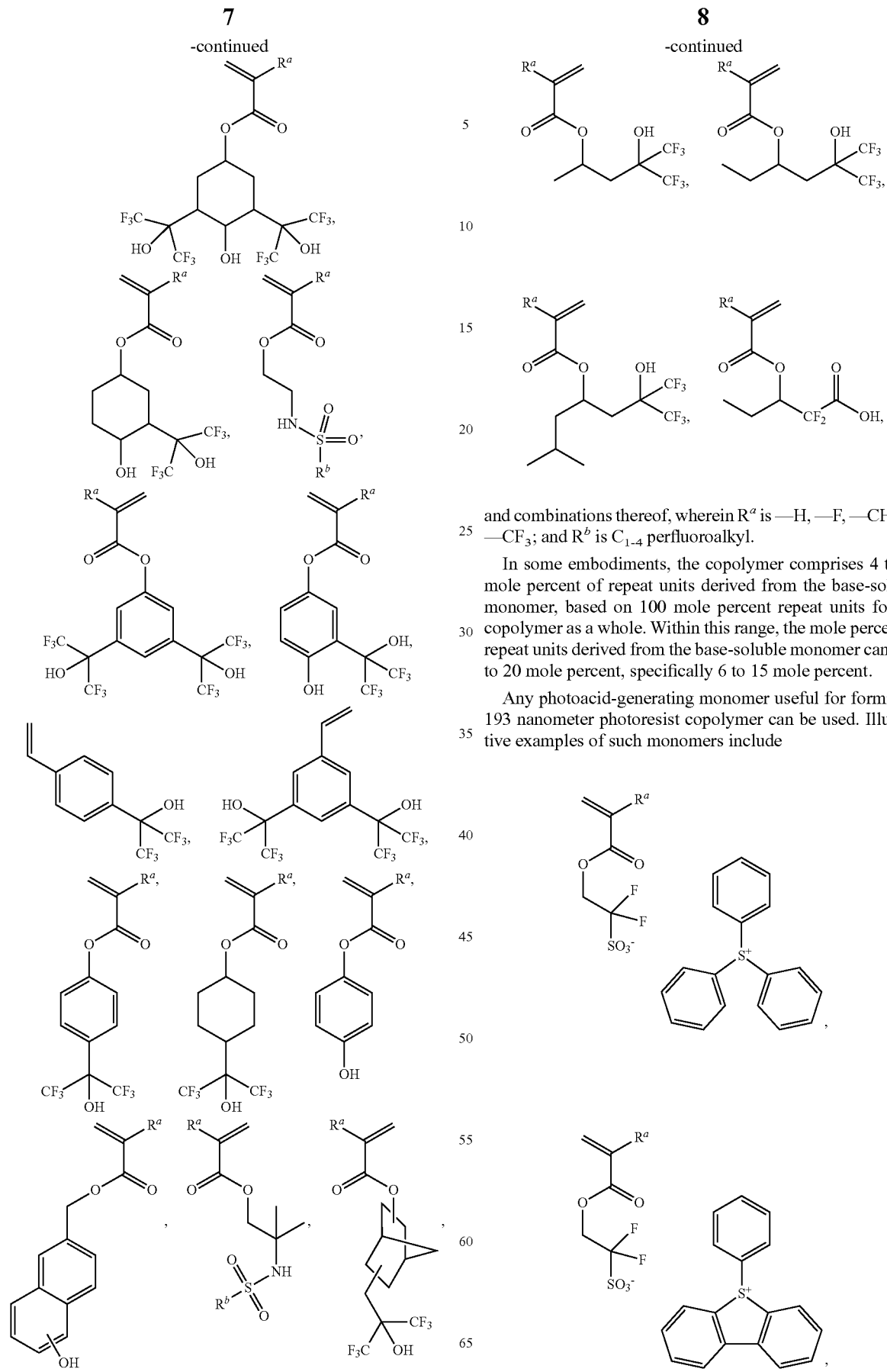

and combinations thereof, wherein $R^a$ is —H, —F, —CH$_3$, or —CF$_3$; and $R^b$ is C$_{1-4}$ perfluoroalkyl.

In some embodiments, the copolymer comprises 4 to 30 mole percent of repeat units derived from the base-soluble monomer, based on 100 mole percent repeat units for the copolymer as a whole. Within this range, the mole percent of repeat units derived from the base-soluble monomer can be 5 to 20 mole percent, specifically 6 to 15 mole percent.

Any photoacid-generating monomer useful for forming a 193 nanometer photoresist copolymer can be used. Illustrative examples of such monomers include

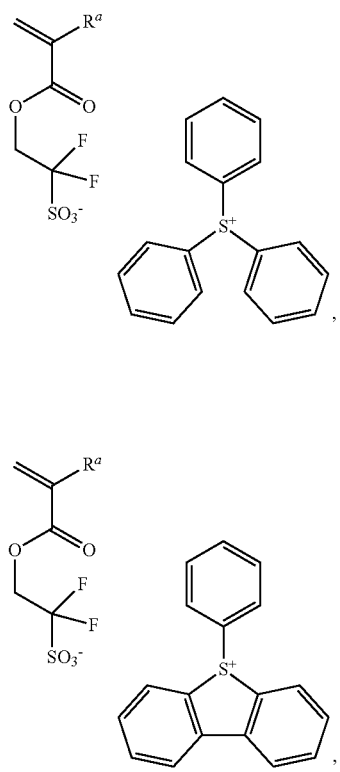

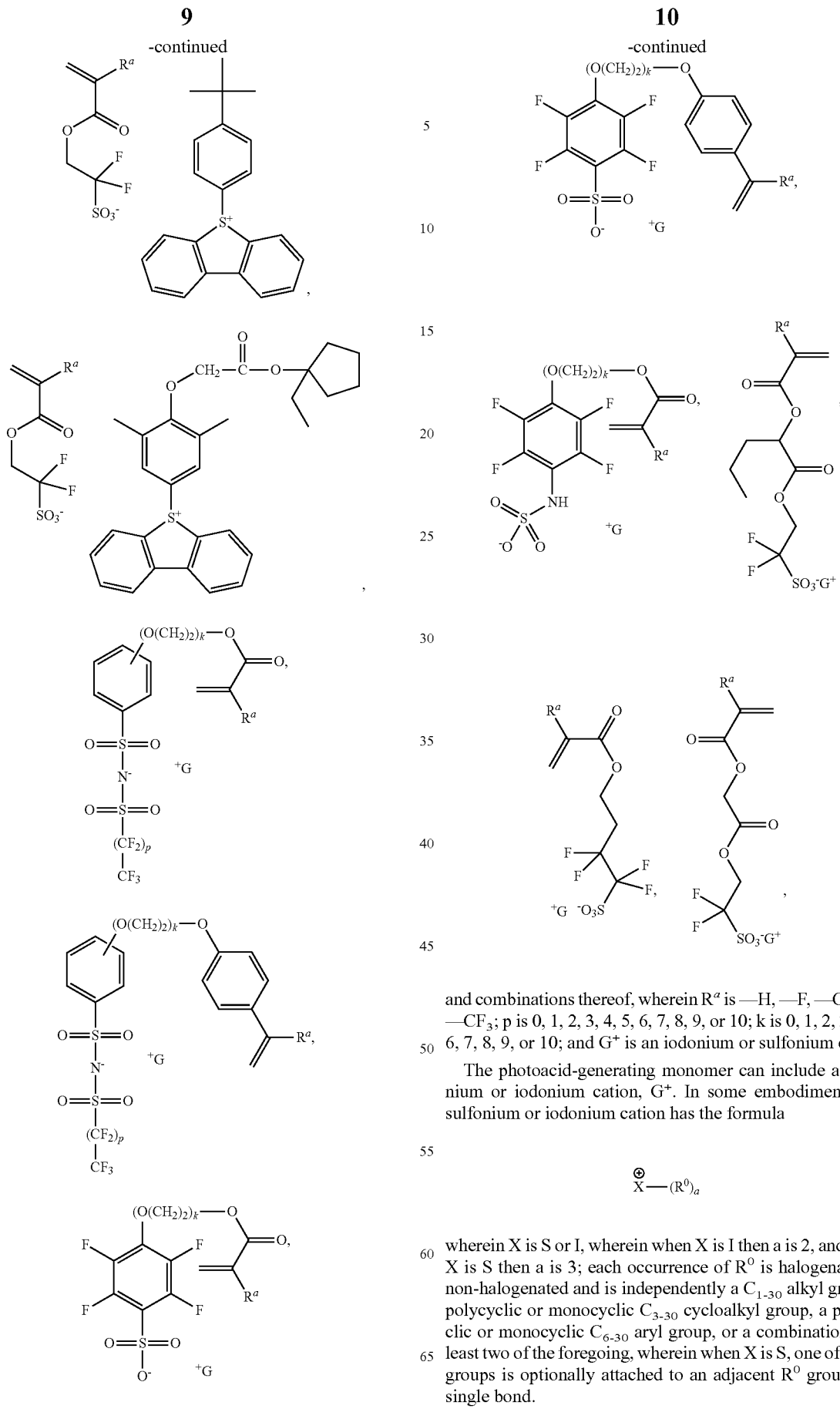

and combinations thereof, wherein $R^a$ is —H, —F, —CH$_3$, or —CF$_3$; p is 0, 1, 2, 3, 4, 5, 6, 7, 8, 9, or 10; k is 0, 1, 2, 3, 4, 5, 6, 7, 8, 9, or 10; and G$^+$ is an iodonium or sulfonium cation.

The photoacid-generating monomer can include a sulfonium or iodonium cation, G$^+$. In some embodiments, the sulfonium or iodonium cation has the formula $$\overset{\oplus}{X}\!\!-\!\!(R^0)_a$$

wherein X is S or I, wherein when X is I then a is 2, and when X is S then a is 3; each occurrence of $R^0$ is halogenated or non-halogenated and is independently a $C_{1-30}$ alkyl group, a polycyclic or monocyclic $C_{3-30}$ cycloalkyl group, a polycyclic or monocyclic $C_{6-30}$ aryl group, or a combination of at least two of the foregoing, wherein when X is S, one of the $R^0$ groups is optionally attached to an adjacent $R^0$ group by a single bond.

Additional examples of photoacid-generating monomers include
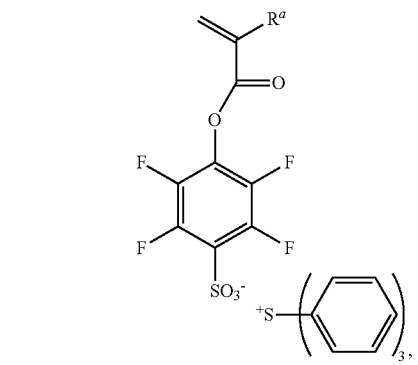
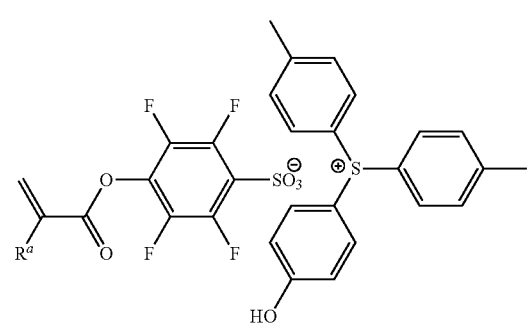
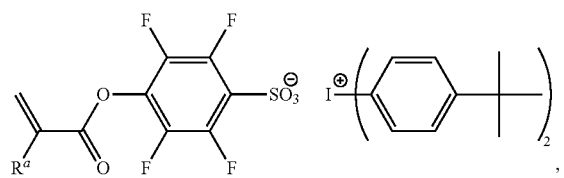
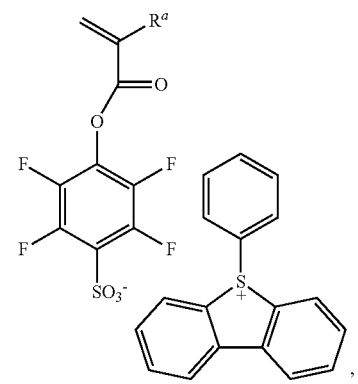
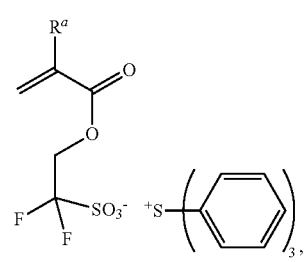
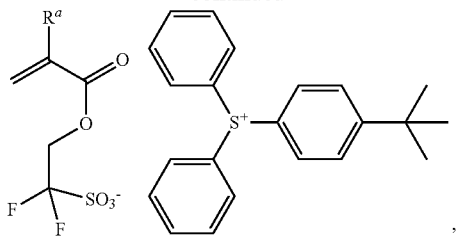
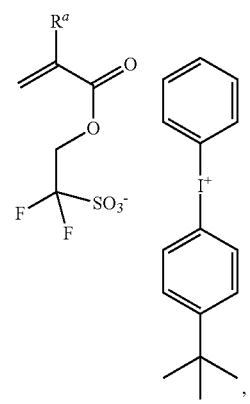
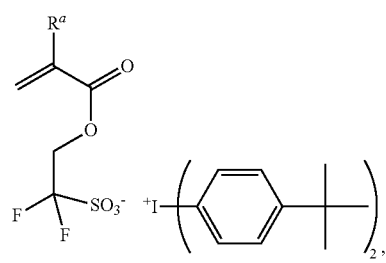
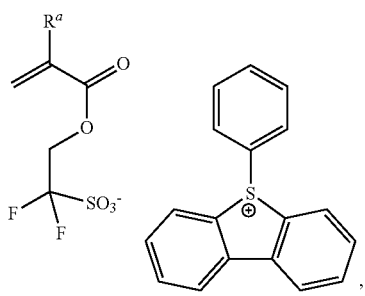
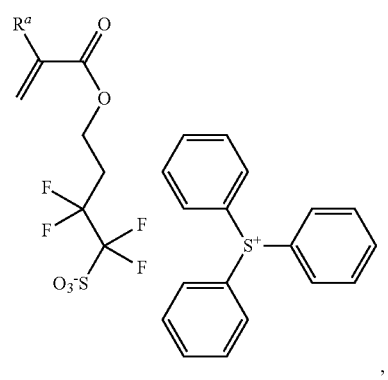

-continued

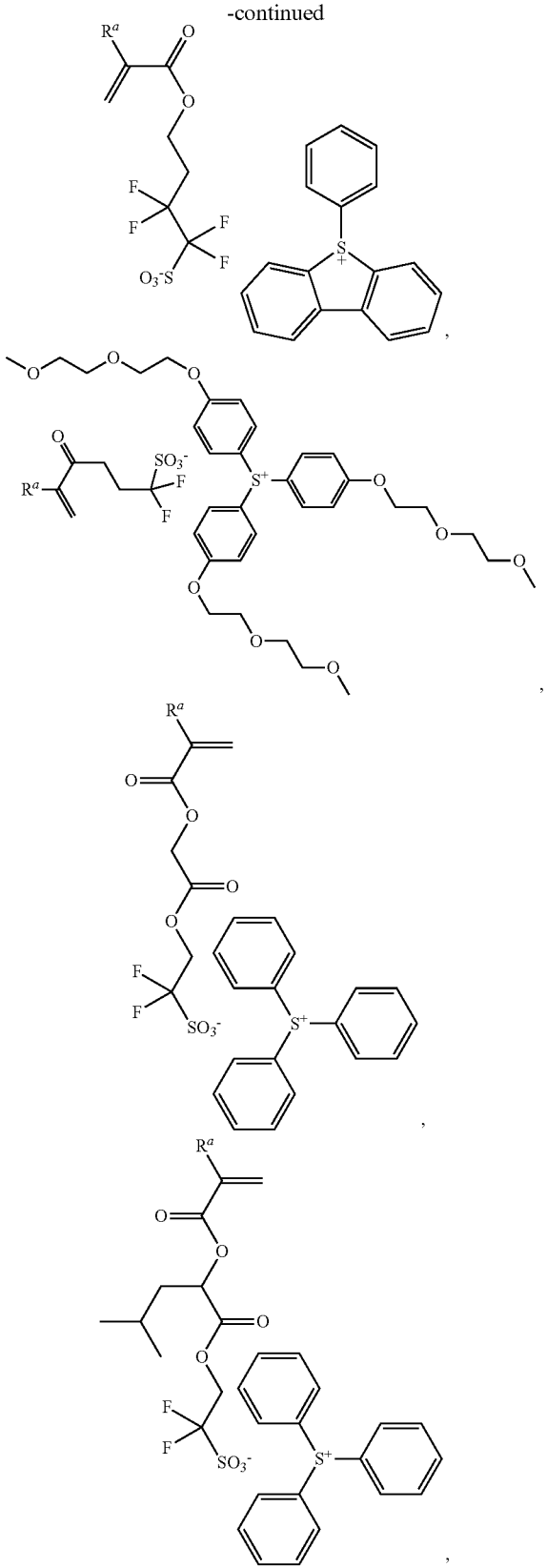

and combinations of at least two of the foregoing, where each $R^a$ is independently H, F, —CN, $C_{1-10}$ alkyl, or $C_{1-10}$ fluoroalkyl.

In some embodiments, the copolymer comprises 2 to 20 mole percent of repeat units derived from the photoacid-generating monomer, based on 100 mole percent repeat units for the copolymer as a whole. Within this range, the mole percent of repeat units derived from the photoacid-generating monomer can be 3 to 15 mole percent, specifically 4 to 10 mole percent.

In a specific embodiment of the copolymer, the lactone-substituted monomer comprises

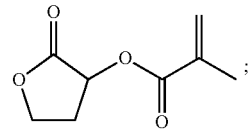

the base-soluble monomer comprises

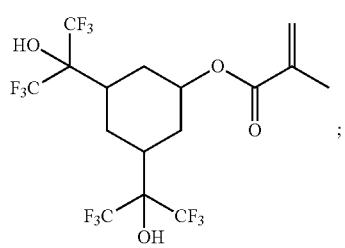 [SMILES: C=C(C)C(=O)OC1CC(C(O)(C(F)(F)F)C(F)(F)F)CC(C(O)(C(F)(F)F)C(F)(F)F)C1]

and
the photoacid-generating monomer comprises

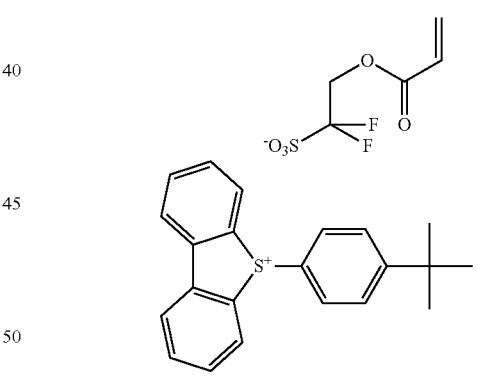

In another specific embodiment of the copolymer, the acid-labile monomer comprises

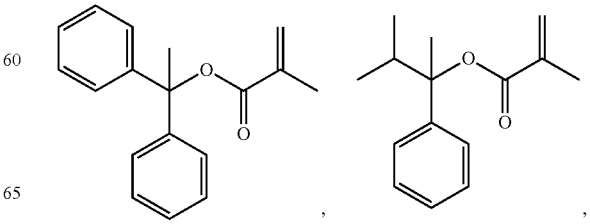

-continued

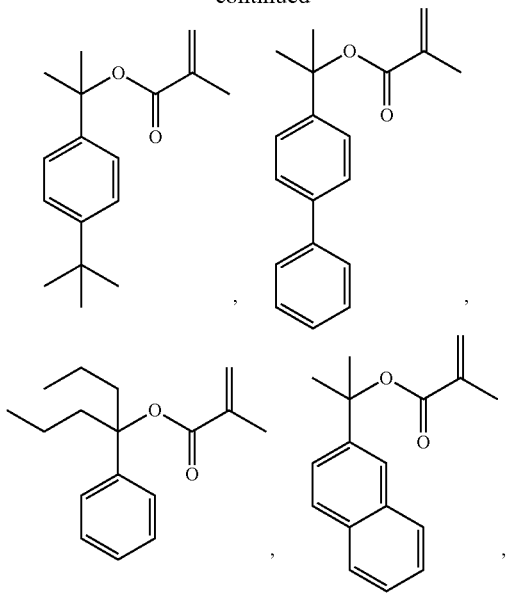

or a combination thereof, the lactone-substituted monomer comprises

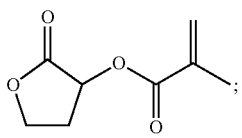

;

the base-soluble monomer comprises

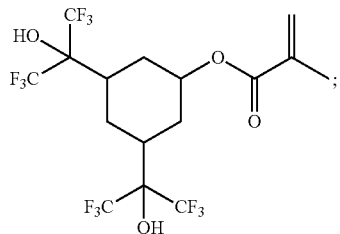 [SMILES: C=C(C)C(=O)OC1CC(C(O)(C(F)(F)F)C(F)(F)F)CC(C(O)(C(F)(F)F)C(F)(F)F)C1]

;

and
the photoacid-generating monomer comprises

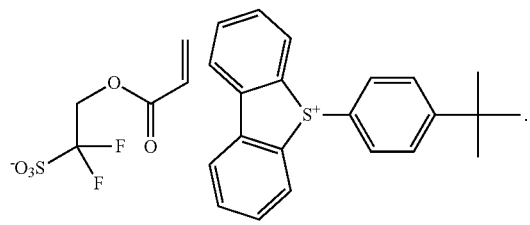

.

One embodiment is a photoresist composition comprising the copolymer in any of its above-described variations. The photoresist composition can contain the copolymer is an amount of 50 to 99 weight percent, based on the total weight of solids (excluding solvent) in the photoresist composition. Within this range, the copolymer content of the photoresist can be 55 to 95 weight percent, specifically 65 to 90 weight percent.

The photoresist composition can further include one or more photoactive components such as photoacid generators, photobase generators, photoinitiators, additional (meth)acrylate-based polymers with or without bound photoacid generators, polyhydroxystyrene-based polymers with or without bound photoacid generators, and combinations thereof.

Photoacid generators generally include those photoacid generators suitable for the purpose of preparing photoresists. Photoacid generators include, for example, non-ionic oximes and various onium ion salts. Onium ions include, for example, unsubstituted and substituted ammonium ions, unsubstituted and substituted phosphonium ions, unsubstituted and substituted arsonium ions, unsubstituted and substituted stibonium ions, unsubstituted and substituted bismuthonium ions, unsubstituted and substituted oxonium ions, unsubstituted and substituted sulfonium ions, unsubstituted and substituted selenonium ions, unsubstituted and substituted telluronium ions, unsubstituted and substituted fluoronium ions, unsubstituted and substituted chloronium ions, unsubstituted and substituted bromonium ions, unsubstituted and substituted iodonium ions, unsubstituted and substituted aminodiazonium ions (substituted hydrogen azide), unsubstituted and substituted hydrocyanonium ions (substituted hydrogen cyanide), unsubstituted and substituted diazenium ions ($RN=N^+R_2$), unsubstituted and substituted iminium ions ($R_2C=N^+R_2$), quaternary ammonium ions having two double-bonded substituents ($R=N^+=R$), nitronium ion ($NO_2^+$), bis(trarylphosphine)iminium ions (($Ar_3P)_2N^+$), unsubstituted or substituted tertiary ammonium having one triple-bonded substituent ($R\equiv^*NH^+$), unsubstituted and substituted nitrilium ions ($RC\equiv NR^+$), unsubstituted and substituted diazonium ions ($N\equiv N^+R$), tertiary ammonium ions having two partially double-bonded substituents ($R=\!=\!=N^+H=\!=\!=R$), unsubstituted and substituted pyridinium ions, quaternary ammonium ions having one triple-bonded substituent and one single-bonded substituent ($R\equiv N^+R$), tertiary oxonium ions having one triple-bonded substituent ($R\equiv O^+$), nitrosonium ion ($N\equiv O^+$), tertiary oxonium ions having two partially double-bonded substituents ($R=\!=\!=O^+=\!=\!=R$), pyrylium ion ($C_5H_5O^+$), tertiary sulfonium ions having one triple-bonded substituent ($R\equiv S^+$), tertiary sulfonium ions having two partially double-bonded substituents ($R=\!=\!=S^+=\!=\!=R$), and thionitrosonium ion ($N\equiv S^+$). In some embodiments, the onium ion is selected from unsubstituted and substituted diaryiodonium ions, and unsubstituted and substituted triarylsulfonium ions. Examples of suitable onium salts can be found in U.S. Pat. No. 4,442,197 to Crivello et al., U.S. Pat. No. 4,603,101 to Crivello, and U.S. Pat. No. 4,624,912 to Zweifel et al.

Suitable photoacid generators are known in the art of chemically amplified photoresists and include, for example: onium salts, for example, triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate; nitrobenzyl derivatives, for example, 2-nitrobenzyl-p-toluenesulfonate, 2,6-dinitrobenzyl-p-toluenesulfonate, and 2,4-dinitrobenzyl-p-toluenesulfonate; sulfonic acid esters, for example, 1,2,3-tris(methanesulfonyloxy)benzene, 1,2,3-tris(trifluoromethanesulfonyloxy)benzene, and 1,2,3-tris(p-toluenesulfonyloxy)benzene; diazomethane derivatives, for example, bis(benzenesulfonyl)diazomethane, bis(p-toluenesulfonyl)diazomethane; glyoxime derivatives, for example, bis-O-(p-toluenesulfonyl)-α- dimethylglyoxime, and bis-O-(n-butanesulfonyl)-α-dimethylglyoxime; sulfonic acid ester derivatives of an N-hydroxyimide compound, for example, N-hydroxysuccinimide methanesulfonic acid ester, N-hydroxysuccinimide trifluoromethanesulfonic acid ester; and halogen-containing triazine compounds, for example, 2-(4-methoxyphenyl)-4,6-bis(trichloromethyl)-1,3,5-triazine, and 2-(4-methoxynaphthyl)-4,6-bis(trichloromethyl)-1,3,5-triazine. Suitable photoacid generators with specific examples are further described in U.S. Pat. No. 8,431,325 to Hashimoto et al. in column 37, lines 11-47 and columns 41-91.

Two specific PAGS are the following PAG 1 and PAG2, the preparation of which is described in U.S. Patent Application Ser. No. 61/701,588, filed Sep. 15, 2012.

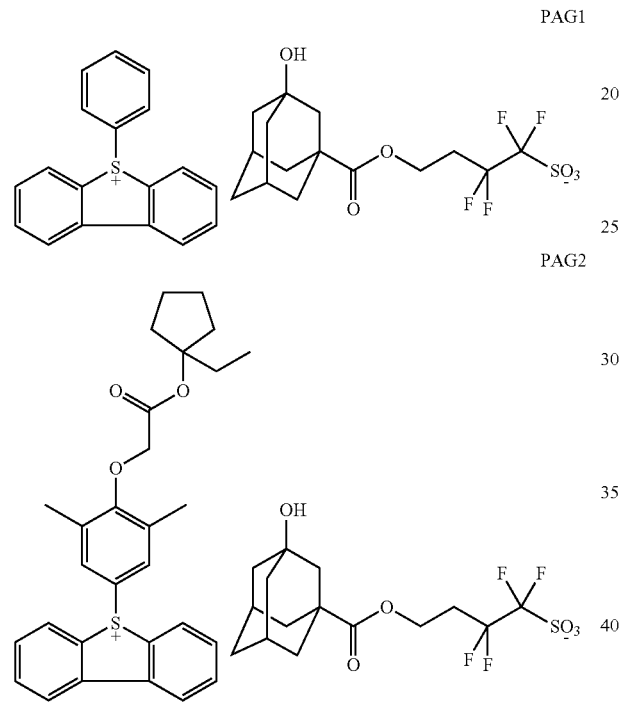

Other suitable sulfonate PAGS include sulfonated esters and sulfonyloxy ketones. See *J. of Photopolymer Science and Technology*, 4(3):337-340 (1991), for disclosure of suitable sulfonate PAGS, including benzoin tosylate, t-butylphenyl α-(p-toluenesulfonyloxy)-acetate and t-butyl α-(p-toluenesulfonyloxy)-acetate. Preferred sulfonate PAGs are also disclosed in U.S. Pat. No. 5,344,742 to Sinta et al.

Other useful photoacid generators include the family of nitrobenzyl esters, and the s-triazine derivatives. Suitable s-triazine photoacid generators are disclosed, for example, in U.S. Pat. No. 4,189,323.

Halogenated non-ionic, photoacid generating compounds are also suitable such as, for example, 1,1-bis[p-chlorophenyl]-2,2,2-trichloroethane (DDT); 1,1-bis[p-methoxyphenyl]-2,2,2-trichloroetnane; 1,2,5,6,9,10-hexabromocyclodecane; 1,10-dibromodecane; 1,1-bis[p-chlorophenyl]-2,2-dichloroethane; 4,4-dichloro-2-(trichloromethyl)benzhydrol; hexachlorodimethyl sulfone; 2-chloro-6-(trichloromethyl)pyridine; o,o-diethyl-o-(3,5,6trichloro-2-pyridyl)phosphorothionate; 1,2,3,4,5,6-hexachlorocyclohexane; N(1,1-bis[p-chlorophenyl]-2,2,2-trichloroethyl)acetamide; tris[2,3-dibromopropyl] isocyanurate; 2,2-bis[p-chlorophenyl]-1,1-dichloroethylene; tris[trichloromethyl]s-triazine; and their isomers, analogs, homologs, and residual compounds. Suitable photoacid generators are also disclosed in European Patent Application Nos. 0164248 and 0232972. Photoacid generators that are particularly preferred for deep U.V. exposure include 1,1-bis(p-chlorophenyl)-2,2,2-trichloroethane (DDT); 1,1-bis(p-methoxyphenol)-2,2,2-trichloroethane; 1,1-bis(chlorophenyl)-2,2,2 trichloroethanol; tris(1,2,3-methanesulfonyl) benzene; and tris(trichloromethyl)triazine.

Photoacid generators further include photo-destroyable bases. Photo-destroyable bases include photo-decomposable cations, and preferably those useful for preparing PAGs, paired with an anion of a weak ($pK_a>2$) acid such as, for example, a $C_{1-20}$ carboxylic acid. Exemplary such carboxylic acids include formic acid, acetic acid, propionic acid, tartaric acid, succinic acid, cyclohexylcarboxylic acid, benzoic acid, salicylic acid, and other such carboxylic acids. Exemplary photo-destroyable bases include those combining cations and anions of the following structures where the cation is triphenylsulfonium or one of the following:

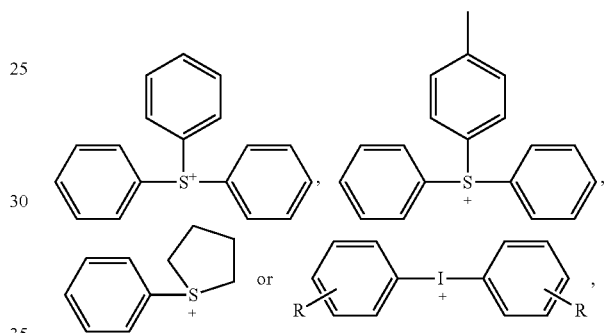

where R is independently H, a $C_{1-20}$ alkyl, a $C_{6-20}$ aryl, or a $C_{6-20}$ alkyl aryl, and the anion is

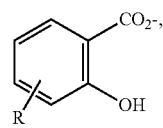

RC(=O)—O⁻, or ⁻OH,
where R is independently H, a $C_{1-20}$ alkyl, a $C_{1-20}$ alkoxyl, a $C_{6-20}$ aryl, or a $C_{6-20}$ alkyl aryl.

The photoresist can include a photobase generator, including those based on non-ionic photo-decomposing chromophores such as, for example, 2-nitrobenzyl groups and benzoin groups. An exemplary photobase generator is ortho-nitrobenzyl carbamate.

The photoresist can include a photoinitiator. Photoinitiators are used in the photoresist composition for initiating polymerization of the cross-linking agents by generation of free-radicals. Suitable free radical photoinitiators include, for example, azo compounds, sulfur containing compounds, metallic salts and complexes, oximes, amines, polynuclear compounds, organic carbonyl compounds and mixtures thereof as described in U.S. Pat. No. 4,343,885, column 13, line 26 to column 17, line 18; and 9,10-anthraquinone; 1-chloroanthraquinone; 2-chloroanthraquinone; 2-methylanthraquinone; 2-ethylanthraquinone; 2-tert-butylanthraquinone; octamethylanthraquinone; 1,4-naphthoquinone; 9,10-phenanthrenequinone; 1,2- benzanthraquinone; 2,3-benzanthraquinone; 2-methyl-1,4-naphthoquinone; 2,3-dichloronaphthoquinone; 1,4-dimethylanthraquinone; 2,3-dimethylanthraquinone; 2-phenylanthraquinone; 2,3-diphenylanthraquinone; 3-chloro-2-methylanthraquinone; retenequinone; 7,8,9,10-tetrahydronaphthalenequinone; and 1,2,3,4-tetrahydrobenz(a)anthracene-7,12-dione. Other photoinitiators are described in U.S. Pat. No. 2,760,863 and include vicinal ketaldonyl alcohols, such as benzoin, pivaloin, acyloin ethers, e.g., benzoin methyl and ethyl ethers; and alpha-hydrocarbon-substituted aromatic acyloins, including alpha-methylbenzoin, alpha-allylbenzoin, and alpha-phenylbenzoin. Photoreducible dyes and reducing agents disclosed in U.S. Pat. Nos. 2,850,445; 2,875,047; and 3,097,096 as well as dyes of the phenazine, oxazine, and quinone classes; benzophenone, 2,4,5-triphenylimidazolyl dimers with hydrogen donors, and mixtures thereof as described in U.S. Pat. Nos. 3,427,161; 3,479,185; and 3,549,367 can be also used as photoinitiators.

The photoresist composition can further include a surfactant. Illustrative surfactants include fluorinated and non-fluorinated surfactants, and are preferably non-ionic. Exemplary fluorinated non-ionic surfactants include perfluoro $C_4$ surfactants such as FC-4430 and FC-4432 surfactants, available from 3M Corporation; and fluorodiols such as POLYFOX™ PF-636, PF-6320, PF-656, and PF-6520 fluorosurfactants from Omnova.

The photoresist composition can further include quenchers that are non-photo-destroyable bases. These include, for example, those based on hydroxides, carboxylates, amines, imines and amides. Such quenchers include $C_{1-30}$ organic amines, imines or amides, $C_{1-30}$ quaternary ammonium salts of strong bases (e.g., a hydroxide or alkoxide) or a weak base (e.g., a carboxylate). Exemplary quenchers include amines such as Troger's base; hindered amines such as diazabicycloundecene (DBU), diazabicyclononene (DBN), and tetrahydroxy isopropyl diamine and tert-butyl-4-hydroxy-1-piperidiene carboxylate; ionic quenchers including quaternary alkyl ammonium salts such as tetrabutylammonium hydroxide (TBAH), tetramethylammonium 2-hydroxybenzoic acid (TMA OHBA), and tetrabutylammonium lactate. Suitable quenchers are further described in U.S. Pat. No. 8,431,325 to Hashimoto et al.

The photoresist components are typically dissolved in a solvent for dispensing and coating. Exemplary solvents include anisole; alcohols including 1-methoxy-2-propanol, and 1-ethoxy-2 propanol; esters including n-butyl acetate, ethyl lactate, 1-methoxy-2-propyl acetate, methoxyethoxy propionate, and ethoxyethoxy propionate; ketones including cyclohexanone and 2-heptanone; and combinations thereof. The solvent amount can be, for example, 70 to 99 weight percent, specifically 85 to 98 weight percent, based on the total weight of the photoresist composition.

In some embodiments, the photoresist composition in solution comprises the polymer in an amount of 50 to 99 weight percent, specifically 55 to 95 weight percent, more specifically 65 to 90 based on the total weight of solids. It will be understood that "polymer" used in this context of a component in a photoresist may mean only the copolymer disclosed herein, or a combination of the copolymer with another polymer useful in a photoresist. The photo-destroyable base may be present in the photoresist in an amount of 0.01 to 5 weight percent, specifically 0.1 to 4 weight percent, more specifically 0.2 to 3 weight percent, based on the total weight of solids. A surfactant may be included in an amount of 0.01 to 5 weight percent, specifically 0.1 to 4 weight percent, more specifically 0.2 to 3 weight percent, based on the total weight of solids. A photoacid generator is included in the amounts of 0 to 50 weight percent, specifically 1.5 to 45 weight percent, more specifically 2 to 40 weight percent, based on the total weight of solids. It will be understood that total solids includes polymer, photo-destroyable base, quencher, surfactant, any added PAG, and any optional additives, exclusive of solvent.

Another embodiment is a coated substrate comprising: (a) a substrate having one or more layers to be patterned on a surface thereof; and (b) a layer of the photoresist composition of over the one or more layers to be patterned.

The substrate can be of a material such as a semiconductor, such as silicon or a compound semiconductor (e.g., III-V or II-VI), glass, quartz, ceramic, copper and the like. Typically, the substrate is a semiconductor wafer, such as single crystal silicon or compound semiconductor wafer, having one or more layers and patterned features formed on a surface thereof. Optionally, the underlying base substrate material itself may be patterned, for example, when it is desired to form trenches in the base substrate material. Layers formed over the base substrate material may include, for example, one or more conductive layers such as layers of aluminum, copper, molybdenum, tantalum, titanium, tungsten, and alloys, nitrides or silicides of such metals, doped amorphous silicon or doped polysilicon, one or more dielectric layers such as layers of silicon oxide, silicon nitride, silicon oxynitride or metal oxides, semiconductor layers, such as single-crystal silicon, underlayers, antireflective layers such as a bottom antireflective layers, and combinations thereof. The layers can be formed by various techniques, for example, chemical vapor deposition (CVD) such as plasma-enhanced CVD, low-pressure CVD or epitaxial growth, physical vapor deposition (PVD) such as sputtering or evaporation, electroplating or spin-coating.

The invention further includes a method of forming an electronic device, comprising: (a) applying a layer of any of the photoresist compositions described herein on a substrate; (b) pattern-wise exposing the photoresist composition layer to activating (e.g., ultraviolet or electron beam) radiation; (c) developing the exposed photoresist composition layer to provide a resist relief image. The method can, optionally, further include (d) etching the resist relief pattern into the underlying substrate.

Applying the photoresist composition to the substrate can be accomplished by any suitable method, including spin coating, spray coating, dip coating, and doctor blading. In some embodiments, applying the layer of photoresist composition is accomplished by spin coating the photoresist in solvent using a coating track, in which the photoresist composition is dispensed on a spinning wafer. During dispensing, the wafer can be spun at a speed of up to 4,000 rotations per minute (rpm), specifically 500 to 3,000 rpm, and more specifically 1,000 to 2,500 rpm. The coated wafer is spun to remove solvent, and baked on a hot plate to remove residual solvent and free volume from the film to make it uniformly dense.

Pattern-wise exposure is then carried out using an exposure tool such as a stepper, in which the film is irradiated through a pattern mask and thereby is exposed pattern-wise. In some embodiments, the method uses advanced exposure tools generating activating radiation at wavelengths capable of high resolution including extreme-ultraviolet (EUV) or electron-beam (e-beam) radiation. It will be appreciated that exposure using the activating radiation decomposes the PAG in the exposed areas and generates acid and decomposition by-products, and that the acid then effects a chemical change in the polymer (deblocking the acid sensitive groups to generate a base-soluble group, or alternatively, catalyzing a cross-linking reaction in the exposed areas) during the post exposure bake (PEB) step. The resolution of such exposure tools can be less than 30 nanometers.

Developing the exposed photoresist layer is then accomplished by treating the exposed layer with a suitable developer capable of selectively removing the exposed portions of the film (where the photoresist is positive tone) or removing the unexposed portions of the film (where the photoresist is crosslinkable in the exposed regions, i.e., negative tone). In some embodiments, the photoresist is positive tone based on a polymer having acid-sensitive (deprotectable) groups, and the developer is preferably a metal-ion-free tetraalkylammonium hydroxide solution, such as, for example, aqueous 0.26 Normal tetramethylammonium hydroxide. Alternatively, negative tone development (NTD) can be conducted by use of a suitable organic solvent developer. NTD results in the removal of unexposed regions of the photoresist layer, leaving behind exposed regions due to polarity reversal of those regions. Suitable NTD developers include, for example, ketones, esters, ethers, hydrocarbons, and mixtures thereof. Other suitable solvents include those used in the photoresist composition. In some embodiments, the developer is 2-heptanone or a butyl acetate such as n-butyl acetate. Whether the development is positive tone or negative tone, a pattern forms by developing.

The photoresist can, when used in one or more such a pattern-forming processes, be used to fabricate electronic and optoelectronic devices such as memory devices, processor chips (including central processing units or CPUs), graphics chips, and other such devices.

EXAMPLES

Table 1 lists calculated physical properties for seven acid-labile monomers. Note that Monomer 1 is substituted such that $R^2$ and Ar collectively include seven carbon atoms, and Monomers 2-7 are substituted such that $R^2$ and Ar collectively include at least nine carbon atoms. The physical properties, vapor pressure at 23° C., cLogP and molecular volume, were calculated using Molinspiration software available at http://www.molinspiration.com/cgi-bin/properties. Vapor pressure is assumed to correlate with outgassing under EUV process conditions: the higher the monomer vapor pressure, the higher the propensity of the leaving group to outgas under EUV process conditions.

TABLE 1

| Monomer | Calculated Vapor pressure (mm Hg) | Calculated cLogP | Calculated Molecular Volume (cm³/mol) |
|---|---|---|---|
| 1. | 2.83 | 3.77 | 205.93 |
| 2. | 0.00628 | 4.367 | 266.34 |
| 3. | 0.267 | 4.517 | 239.31 |
| 4. | 0.112 | 5.477 | 272.11 |
| 5. | 0.000676 | 5.566 | 277.33 |
| 6. | 0.0298 | 5.895 | 273.13 |

TABLE 1-continued

| Monomer | Calculated Vapor pressure (mm Hg) | Calculated cLogP | Calculated Molecular Volume (cm³/mol) |
|---|---|---|---|
| 7. | 0.0058 | 4.945 | 249.92 |

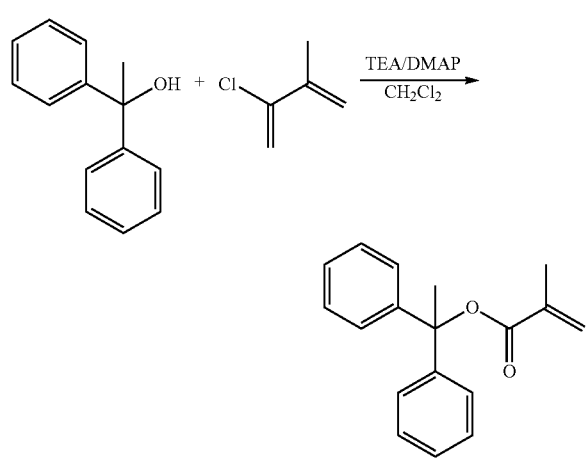

Synthesis of 1,1-diphenylethyl methacrylate (2). A scheme for the synthesis of 1,1-diphenylethyl methacrylate is shown above, where "TEA" refers to triethylamine, "DMAP" to 4-(N,N-dimethylamino)pyridine, and "CH$_2$Cl$_2$" to methylene chloride. To synthesize this monomer, 25 grams (0.126 moles) of 1,1-diphenylethanol was treated with 14 milliliters (0.138 moles) of methacryloyl chloride in methylene chloride (200 milliliters) containing 19.09 grams (0.189 moles) of triethylamine and 5 mole percent of 4-(N,N-dimethylamino) pyridine. The reaction was initiated at 0° C. and the reaction mixture was stirred for 16 hours at room temperature. The reaction mixture was then quenched by washing with 500 milliliters of deionized water and extracted into methylene chloride. Volatiles were removed from the resulting solution on a rotary evaporator to afford 25 grams of a beige solid that was further purified through by being dissolved in 25 milliliters of a 65:35 weight/weight mixture of methylene chloride and hexanes and passed through an alumina plug, eluting with a 61.75:33.25:5 weight/weight/weight mixture of methylene chloride, hexanes, and triethylamine. Solvent removal afforded 21 grams of 1,1-diphenylethyl methacrylate.

1-Phenyl-1,2-dimethylprop-1-yl methacrylate (3), 1-Phenyl-1-methylethyl methacrylate (4), 1-methyl-1-(2'-naphthyl)ethyl methacrylate (5), 1-(prop-1-yl)-1-phenylbut-1-yl methacrylate (6), and 1-(naphth-2-yl)-1-methylethyl methacrylate (7) were prepared by a similar procedure, starting with the corresponding tertiary alcohols.

The control monomer 1-methyl-1-phenylethyl methacrylate (1) was purchased from ENF Technology and used as received.

Copolymer Synthesis. A feed solution was made by dissolving 1,1-diphenylethyl methacrylate (10 grams, 3.75 millimoles), alpha-methacryloxy gamma-butyrolactone (α-GBLMA; 8.44 grams, 4.96 millimoles), 3,5-bis(1,1,1,3,3,3-hexafluoro-2-hydroxypropan-2-yl)cyclohexane methacrylate (DiHFA; 5.75 grams, 1.14 millimoles), and phenyldibenzothiophenium 1,1-difluoro-2-(methacryloyloxy) ethanesulfonate (TBP PDBTS-F$_2$; 2.87 grams; 0.585 millimoles) in 21.96 grams of a 70:30 volume/volume mixture of ethyl lactate (EL) and gamma-butyrolactone (GBL). Initiator solution was prepared by dissolving 2.59 grams of initiator (obtained as Wako V-65) in 2.59 grams of a 2:1 volume/volume mixture of acetonitrile and tetrahydrofuran.

The copolymerization was carried out in a 2 liter 3-neck round-bottom flask fitted with a water condenser and a thermometer to monitor the reaction in the flask. The contents were stirred using an overhead stirrer. The reactor was charged with 19 grams of a 70:30 volume/volume mixture of ethyl lactate (EL) and gamma-butyrolactone (GBL), and the contents were heated to 75° C. The feed solution and the initiator solution were fed into the reactor using syringe pumps over the course of four hours. The contents were then stirred for two hours, after which the reaction was quenched using hydroquinone (0.05 grams). The contents were cooled to room temperature and diluted with tetrahydrofuran to 25 weight percent solids, and precipitated twice out of 10-fold (by weight) of a 95:5 weight/weight mixture of diisopropyl ether and methanol. The copolymer obtained was dried under vacuum after each precipitation step at 50° C. for 24 hours to yield 15.2 grams of copolymer 2.

Copolymers 1, 3, and 4 were similarly prepared, substituting equimolar quantities of monomers 1, 3, and 4, respectively, for monomer 2.

Photoresist Preparation and Processing. Photoresist compositions containing the copolymers were formulated and evaluated under KrF and EUV exposure conditions. A positive-tone photoresist composition was prepared by combining 4.95 grams copolymer prepared as above, 0.1 gram of a 5 weight percent solution of OMNOVA™ PF656 surfactant in ethyl lactate, 1.0 gram of a 1 weight percent solution of tetrahydroxyisopropylamine, 37.91 grams of hydroxymethyl isobutyrate (HBM) and 156 grams of ethyl lactate. The resist solution was passed through a 0.2 micrometer polytetrafluoroethylene filter. Resist formulations were spun cast to a resist thickness of 50 nanometers on an eight inch (203.2 millimeter) diameter silicon wafers pre-coated with 25 nanometers of underlayer. The films were annealed at 130° C. for 90 seconds and exposed to an EUV light source (NA=0.30; Quad; 0.22σ/0.68σ) using both an open frame array in order to obtain a contrast curve, and through a binary mask containing dark field line/space patterns. The exposed wafers were post-exposure baked at 100° C. for 60 seconds and then developed with 0.26 Normal tetramethylammonium hydroxide solution for 30 seconds.

Photolithographic results are summarized in Table 2, where "Es" is sizing energy, "DOF" is depth of focus, "LWR" is line width roughness, and "PCM" is pattern collapse margin, expressed in nanometers. Exposure latitude was defined as a difference in exposure energy to print +/−10% of the target diameter normalized by the sizing energy. For Examples 1 and 2, the depth of focus is zero because there were no 26 nanometer lines resolved. The results show that copolymers prepared with the low outgassing acid-labile groups demonstrate competitive lithographic performance relative to the comparative example at EUV with improved sensitivity and exposure latitude in some cases.

TABLE 2

|  | C. Ex. 1 | Ex. 1 | Ex. 2 | Ex. 3 |
|---|---|---|---|---|
| Copolymer | 1 | 2 | 3 | 4 |
| Relative Es Dose @ EUV | 1 | 0.95 | 1.16 | 1.62 |
| 26 nm Exposure Latitude (%) | 14.89 | 13.13 | 20.95 | 11.56 |
| DOF (μm) | 200 | 0 | 0 | 185 |
| LWR (nm) | 4.2 | 4.7 | 4.3 | 5.0 |
| Ultimate resolution (nm) | 24 | 24 | 22 | 24 |
| PCM @ 26 nm (nm) | 20.5 | 23.0 | 22.6 | 23.2 |

Outgassing results were determined using the ASML Witness Plate protocol at College of Nanoscale Science and Engineering (CNSE)-SEMATECH resist outgassing program. SEMATECH has built a High Volume Throughput (HVT) tool, that utilizes electron beam exposure system in order to provide data on the contamination potential of the outgas products of a candidate resist by simultaneously irradiating a witness substrate and a nearby resist-coated wafer.

The ASML witness plate resist outgassing protocol has several steps. They include hydrogen cleaning the witness plate to remove any existing contaminants, performing the exposure of the witness plate simultaneous to exposure of the resist coated wafer with a EUV or electron beam radiation then analyzing the witness plate by ellipsometry to measure the contamination. This is followed by another hydrogen cleaning step, and finally X-ray Photoelectron Spectroscopy (XPS) analysis to measure the residual non-cleanable contamination. See, e.g., Y. Kikuchi, E. Shiobara, H. Tanaka, I. Takagi, K. Katayama, N. Sugie, T. Takahashi, S. Inoue, T. Watanabe, T. Harada, and H. Kinoshita, "Study of EUV outgassing spatial distribution toward witness plate in EUV outgas tester", *Proceedings of SPIE*, volume 8679, 86790 M1-M9.

The ellipsometry step was conducted with a Woollam M-2000 ellipsometer to measure the thickness of the contamination growth on the witness plate. Typical results for this technique are a contamination thickness of approximately 3 nanometers measured across a contamination spot a few millimeters wide. The ellipsometer used a nominal spot size of about 150 micrometers to map the thickness across the contamination spot.

After the second hydrogen cleaning step, which removes the cleanable contamination from the witness plate, the residual contamination is too thin to be measured by ellipsometry, and understanding the composition is important, so XPS is used. A Physical Electronics Quantera XPS was used to measure this remaining contamination on the witness plate. A fiducial reference system previously recorded during the ellipsometry scans of the contamination spot was used to ensure measurement at the same location on the witness plate as the peak contamination. Then, the XPS was used to scan that location with measurements of the photo-emission electron energies corresponding to all of the relevant elements in the resist samples. See G. Denbeaux, Y. Kandel, G. Kane, D. Alvarado, M. Upadhyaya, Y. Khopkar, A. Friz, K. Petrillo, J. Sohn, C. Sarma, D. Ashworth, "Resist outgassing contamination growth results using both photon and electron exposures", Proc. of SPIE, volume 8679, pages 86790L-1-7.

Table 3 provides the tool specifications from manufacturer, where the cleanable growth is expressed in nanometers, and the non-cleanable growth is expressed as (dR/R %), where dR/R is the mirror reflectivity loss.

TABLE 3

| Tool | Cleanable Growth (nm) | Non-Cleanable Growth (dR/R%) |
|---|---|---|
| NXE3100 | 3 | 0.23 |
| NXE3300 | 3 | 0.16 |

The results are summarized in Table 4. The results show that the monomer (2) cleanable carbon growth is substantially lower than that of monomer (1), and well within the manufacturer's specifications for the NXE3100 and NXE3300 instruments.

TABLE 4

| Monomer | Cleanable Carbon Growth (nm) | Non-Cleanable Growth (dR/R%) |
|---|---|---|
| 1 | 2.42 | 0.02 |
| 2 | 1.22 | 0.01 |

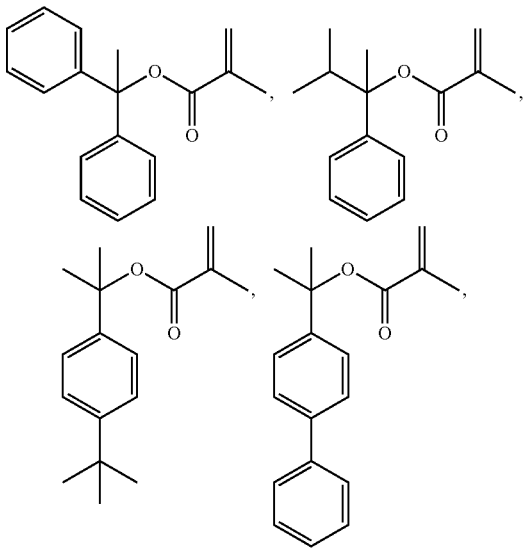

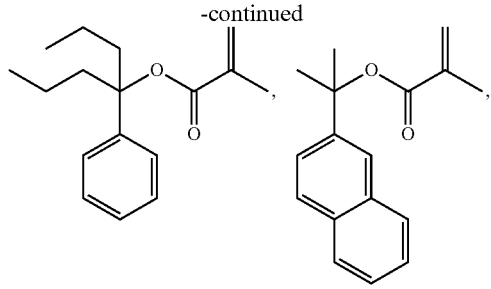
or a combination thereof.
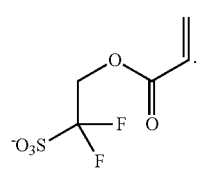

The invention claimed is:

1. A copolymer comprising repeat units derived from an acid-labile monomer having formula (I)

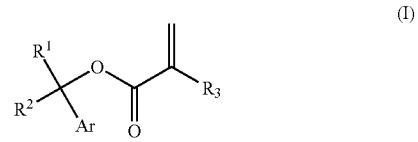

wherein

R$^1$ is an unsubstituted or substituted C$_{1-18}$ alkyl;

R$^2$ is an unsubstituted or substituted C$_{1-18}$ alkyl, an unsubstituted or substituted C$_{7-18}$ arylalkyl, or an unsubstituted or substituted C$_{6-18}$ aryl;

R$^3$ is —H, —F, —CH$_3$, or —CF$_3$; and

Ar is an unsubstituted or substituted C$_{6-18}$ aryl;

provided that R$^2$ and Ar collectively include at least nine carbon atoms;

a lactone-substituted monomer;

a base-soluble monomer having a pK$_a$ less than or equal to 12; and a photoacid-generating monomer comprising

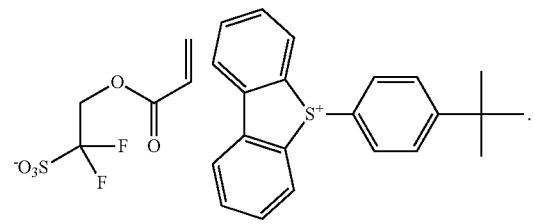

2. The copolymer of claim 1, wherein R$^1$ is C$_{1-3}$ alkyl.

3. The copolymer of claim 1, wherein R$^2$ is C$_{1-3}$ alkyl, phenyl, or C$_{1-6}$ alkyl-substituted phenyl.

4. The copolymer of claim 1, wherein Ar is phenyl, C$_{1-6}$-alkyl-substituted phenyl, biphenyl, or naphthyl.

5. The copolymer of claim 1, wherein the acid-labile monomer comprises

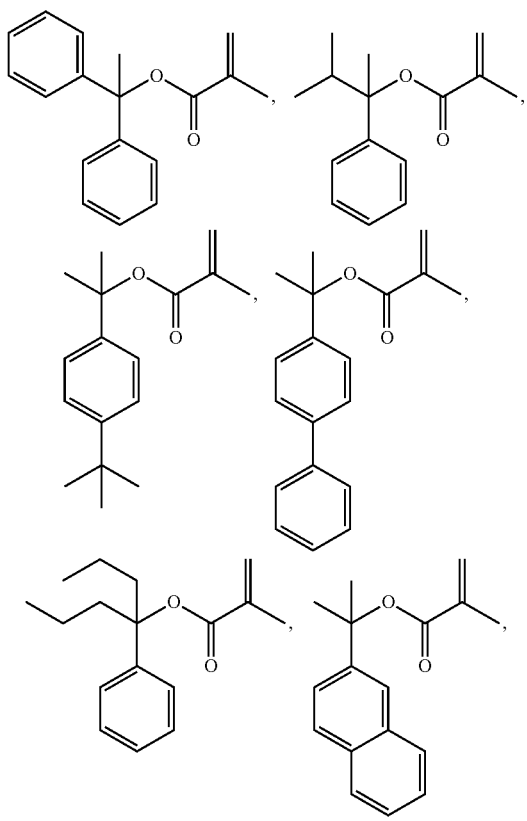

or a combination thereof.

6. A photoresist composition comprising the copolymer of claim 1.

7. A coated substrate comprising:
(a) a substrate having one or more layers to be patterned on a surface thereof; and
(b) a layer of the photoresist composition of claim 6 over the one or more layers to be patterned.

8. A method of forming an electronic device, comprising:
(a) applying a layer of a photoresist composition of claim 6 on a substrate;
(b) pattern-wise exposing the photoresist composition layer to activating radiation; and
(c) developing the exposed photoresist composition layer to provide a resist relief image.

9. A copolymer comprising repeat units derived from an acid-labile monomer having formula (I)

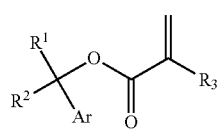
(I)

wherein
$R^1$ is an unsubstituted or substituted $C_{1-18}$ alkyl;
$R^2$ is an unsubstituted or substituted $C_{1-18}$ alkyl, an unsubstituted or substituted $C_{7-18}$ arylalkyl, or an unsubstituted or substituted $C_{6-18}$ aryl;
$R^3$ is —H, —F, —CH$_3$, or —CF$_3$; and
Ar is an unsubstituted or substituted $C_{6-18}$ aryl;
provided that $R^2$ and Ar collectively include at least nine carbon atoms;
a lactone-substituted monomer comprising

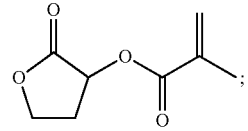

a base-soluble monomer comprising

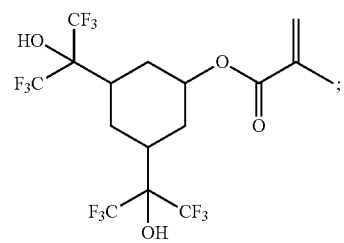 [SMILES: C=C(C)C(=O)OC1CC(C(O)(C(F)(F)F)C(F)(F)F)CC(C(O)(C(F)(F)F)C(F)(F)F)C1]

and
a photoacid-generating monomer comprising

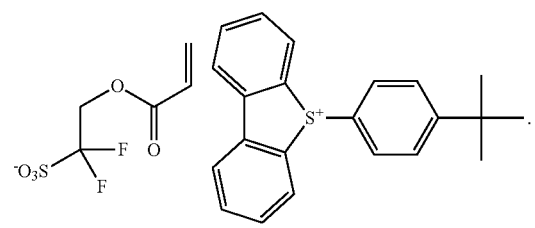

10. The copolymer of claim 9,
wherein the acid-labile monomer comprises